(12) United States Patent
Malhi et al.

(10) Patent No.: US 7,483,300 B2
(45) Date of Patent: Jan. 27, 2009

(54) NON-VOLATILE MEMORY DEVICE

(76) Inventors: Vijay Kumar Malhi, Via A. da Messina, Catania (IT) 95125; Antonino Mondello, Via Comunale Santo, 370/A, Messina (IT) 98148

( * ) Notice: Subject to any disclaimer, the term of this patent is extended or adjusted under 35 U.S.C. 154(b) by 285 days.

(21) Appl. No.: 11/549,067

(22) Filed: Oct. 12, 2006

(65) Prior Publication Data

US 2007/0130415 A1   Jun. 7, 2007

(30) Foreign Application Priority Data

Oct. 13, 2005   (EP)   ................... 05425718

(51) Int. Cl.
*G11C 11/34* (2006.01)
(52) U.S. Cl. .................. 365/185.11; 365/185.09; 365/185.18
(58) Field of Classification Search ............ 365/189.01, 365/185.04, 185.09, 185.11, 189.14, 189.17, 365/185.18, 189.04; 711/103
See application file for complete search history.

(56) References Cited

U.S. PATENT DOCUMENTS

| | | | |
|---|---|---|---|
| 5,974,500 A | 10/1999 | Maletsky et al. | |
| 5,987,563 A | 11/1999 | Itoh et al. | |
| 6,968,460 B1 * | 11/2005 | Gulick | 713/194 |
| 6,992,937 B2 * | 1/2006 | Tran et al. | 365/200 |
| 7,167,394 B2 * | 1/2007 | La Placa et al. | 365/185.2 |
| 7,313,639 B2 * | 12/2007 | Perego et al. | 710/71 |
| 7,392,457 B2 * | 6/2008 | Tamura et al. | 714/763 |
| 2002/0141236 A1 | 10/2002 | Nakai et al. | |
| 2008/0126676 A1 * | 5/2008 | Li et al. | 711/103 |

* cited by examiner

*Primary Examiner*—Richard Elms
*Assistant Examiner*—Hien N Nguyen

(57) ABSTRACT

A non-volatile memory device includes a matrix of non-volatile memory cells, writing circuitry and reading circuitry for the memory cells of the matrix. The device comprises a counter including a sector of non-volatile memory cells and control logic capable of scanning the memory cells of the sector using the reading circuitry and of updating the sector by commanding the writing, using the writing circuitry, of a given value in a memory cell different from the memory cell containing said given value.

17 Claims, 3 Drawing Sheets

NON-VOLATILE MEMORY DEVICE

BACKGROUND OF THE INVENTION

1. Field of the Invention

The present invention refers to a non-volatile memory device.

2. Description of the Related Art

Currently in memory devices the updating of the software is made by canceling the previous version of the software and rewriting the updated version of said software on the memory device. The code corresponding to the installed version of the software remains in the volatile memory of the device and is updated by canceling the code of the previous version.

In said memory devices it is possible to successively reload the software with a successive version but it is also possible to reload with a previous version.

BRIEF SUMMARY OF THE INVENTION

One embodiment of the present invention is a non-volatile memory device that overcomes the above-mentioned inconvenience.

One embodiment of the present invention is a non-volatile memory device comprising a matrix of non-volatile memory cells, writing circuitry, and reading circuitry for said memory cells of the matrix, a counter comprising a sector of non-volatile memory cells, and logic means capable of scanning the memory cells of said sector by means of said reading circuitry and updating said sector by commanding the writing of a given value in a memory cell different from the memory cell containing said given value by means of said writing circuitry.

BRIEF DESCRIPTION OF THE SEVERAL VIEWS OF THE DRAWINGS

The characteristics and the advantages of the present invention will appear evident from the following detailed description of an embodiment thereof, illustrated as non-limiting example in the attached drawings, in which.

DETAILED DESCRIPTION OF THE INVENTION

Figure 1:
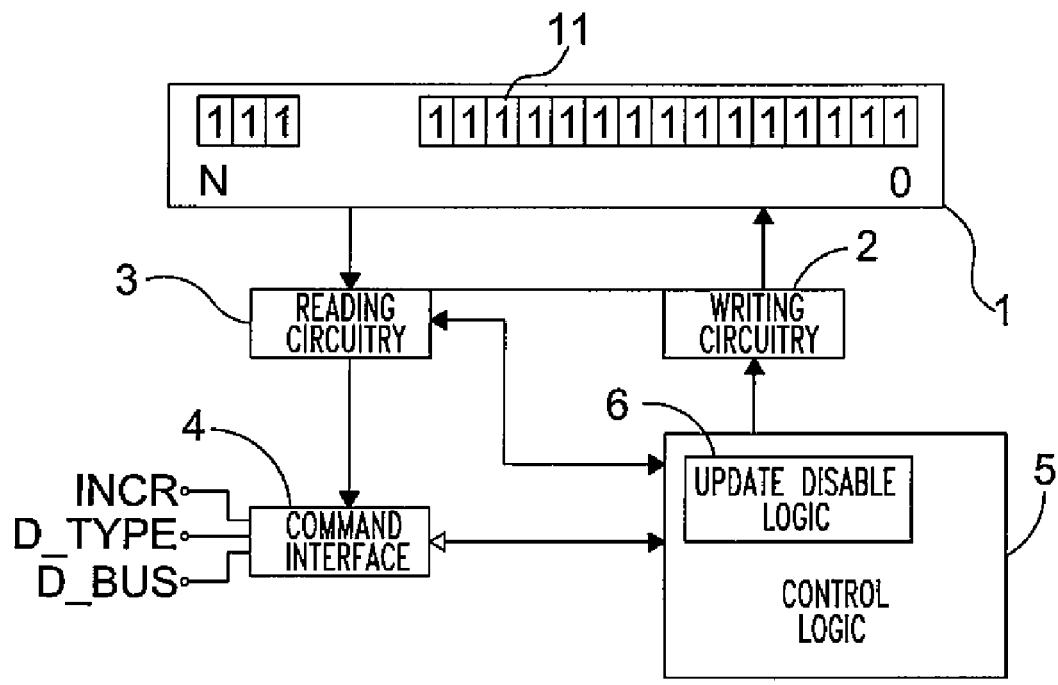
FIG. 1 is a block diagram of a non-volatile memory device according to one embodiment of the present invention.

With reference to FIG. 1 a non-volatile memory device according to one embodiment of the present invention is shown. Said device comprises a non-volatile memory 1 comprising a matrix of memory cells with N rows and M columns (with N different from or equal to M), writing circuitry 2 for writing data on the matrix and reading circuitry 3 for reading data of the matrix. The device comprises an interface 4 connected to the reading and writing circuitry; said interface 4 is suitable for interpreting the external commands sent and for activating the circuitries 2 and 3 for carrying out said commands.

The memory device comprises a logic controller 5, which can be constituted by a microcontroller, for example the microcontroller already present in the memory device, or of another type of logic circuitry; said controller 5 exchanges data with the interface 4 and with the writing and reading circuitries.

A non-volatile counter according to one embodiment of the invention includes a sector 11 of memory cells, that is a group of memory cells, and the logic controller 5. The sector 11 is, for example, a portion of the memory matrix 1 and preferably is constituted by a row of the memory matrix 1. The sector 11 of the memory matrix 1 is used to store the data of the counter in the form of logical values, such as ones and zeros, while the logic controller 5 ensures the continuous updating of the contents of the sector 11 by means of a predefined algorithm. The logic controller 5 uses the reading circuitry 3 to scan the sector 11 and the writing circuitry 2 to update the counter.

The storing of the value in a controller of non-volatile memory is carried out by means of programming a bit, that is by entering a successive one or a successive zero in the sector 11. The counter can be updated in two methods, that is, either by means of a monotonic or sequential method or by means of a non-sequential method.

With the monotonic method the counter is updated by entering a one or a zero in the memory cell adjacent to the cell already containing a one or a zero in the monotonic scanning of the cells while with the non-sequential course the counter is updated entering a one or a zero in the memory cell distant a certain number of cells from the cell containing a one or a zero in the progressive scanning of the memory cells. Preferably the cells of the sector 11 are prepared in the logic state one and therefore the updating is carried out by entering the zero bit.

If the counter is used for memorizing the new version of the software, a command D_bus is sent to the interface 4 that interprets said signal and sends it to the logic controller 5 and a command D_Type to specify the type of sequential or non-sequential updating. In the case of non-sequential updating the interface 4 receives a command Incr to specify the amount of the increase. The latter implements the type of updating desired, that is, monotonic or non-sequential.

Figure 2:
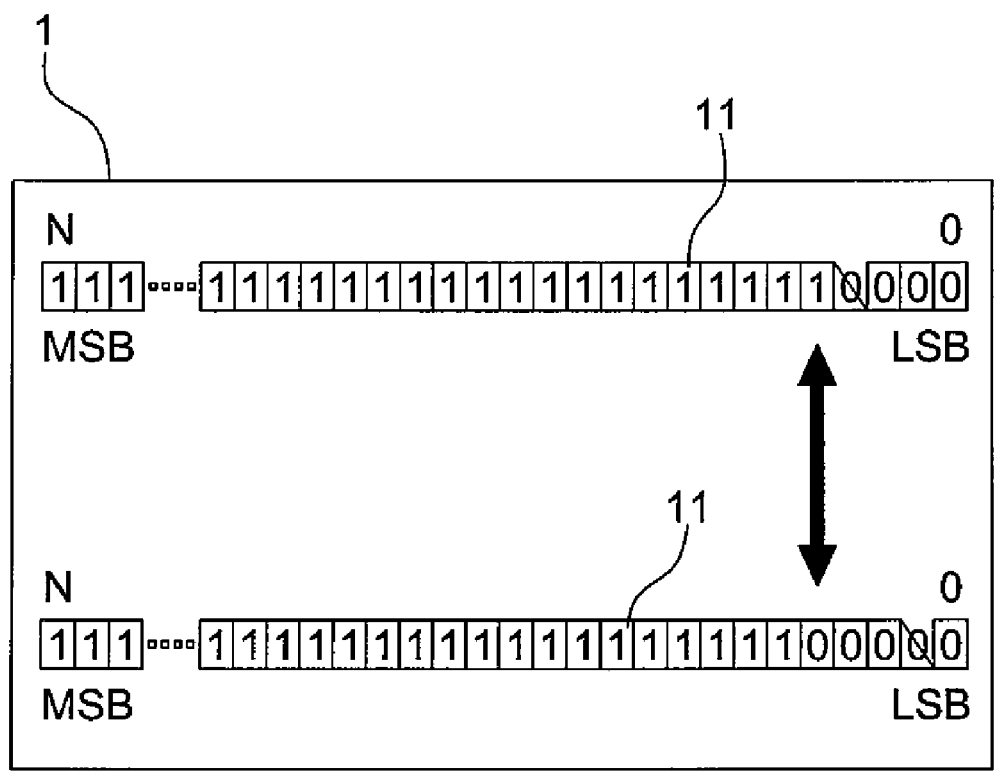
FIGS. 2 and 3 show a part of the counter of the memory device of FIG. 1 with different updating modes.

With the monotonic type of updating the logic controller 5 commands the circuitry 2 to write a zero in a memory cell adjacent to a memory cell that already contains a zero in the sector 11. Therefore, as can be seen in FIG. 2, the zero is written in the memory cell i+1 that is successive and adjacent to the memory cell i, in the direction from the least significant bit (LSB) indicated with 0 to the most significant bit (MSB) indicated with N, and in which the cell i already contains a zero.

Figure 3:
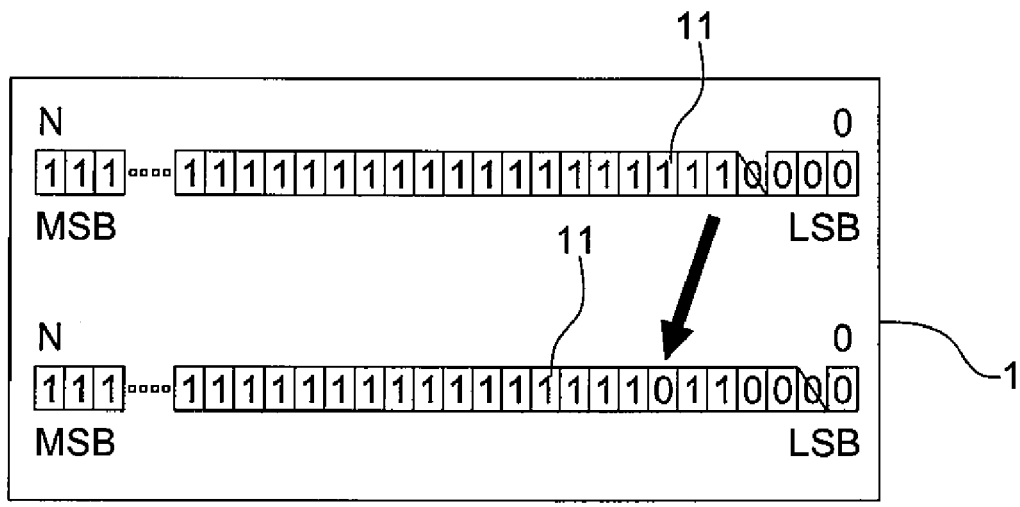

With the non-sequential type of updating the logic controller 5 commands the writing of the zero in a successive cell but not adjacent to that which already contains a zero, in the direction from the least significant bit (LSB) indicated with 0 to the most significant bit (MSB) indicated with N. Therefore, as can be seen in FIG. 3, the zero can be written in the memory cell i+3 that is successive to the memory cell i in the scanning of the cell and in which the cell i already contains a zero while the cells i+1 and i+2 contain ones.

Both for the sequential updating and for the non-sequential the scanning of the cell can be the progressive type as it proceeds from the least significant bit (LSB) indicated with the number 0 to the most significant bit (MSB) indicated with the number N.

Figure 5:
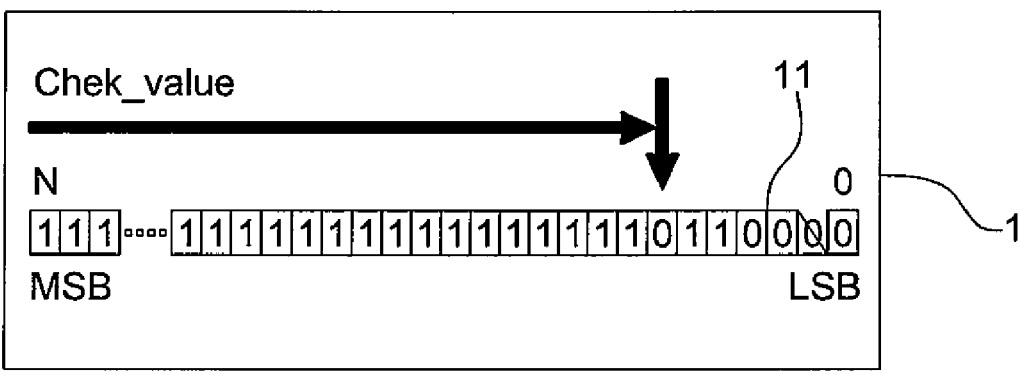
FIG. 5 shows a part of the counter of the device of FIG. 1 with a scanning mode.

The scanning can be also made starting the scanning from the most significant bit (MSB) to the least significant bit (LSB), as shown in FIG. 5 and indicated by the arrow Chek_value. In this manner the first zero found represents the version of software currently installed.

Figure 4:
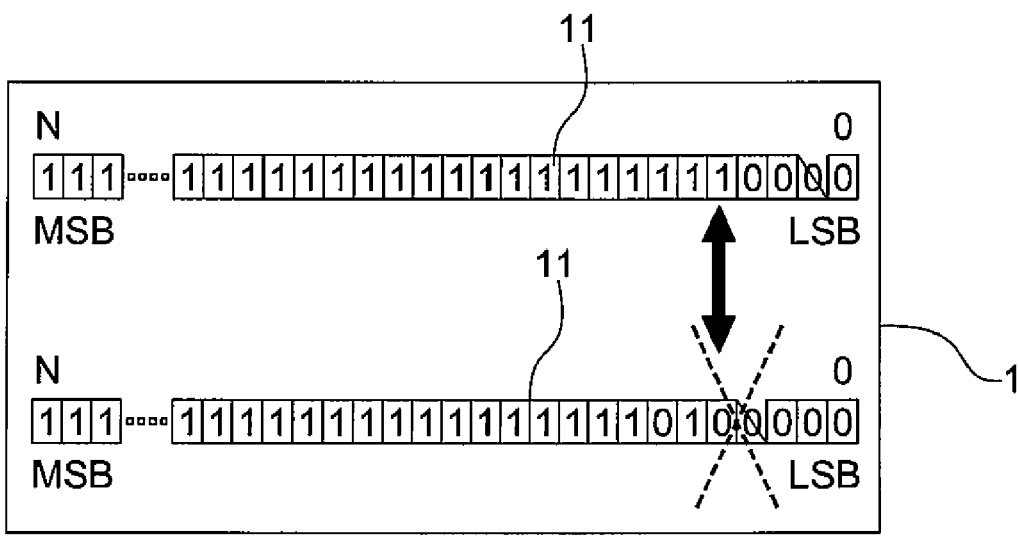
FIG. 4 shows a part of the counter of the memory device of FIG. 1 with a non-possible updating mode.

The logic controller 5 comprises means 6 suitable for impeding the writing of a zero in a memory cell, which, in the scanning of the cell, precedes a memory cell already containing a zero. Therefore, as can be seen in FIG. 4, it is not possible to write a zero in the memory cell i that precedes the memory cell i+2 in the scanning of the cell and in which the cell i+2 already contains a zero. In this manner, in the case of updating a version of software, it is not possible to enter a version of software previous to the version of software already installed in the memory device.

Figure 6:
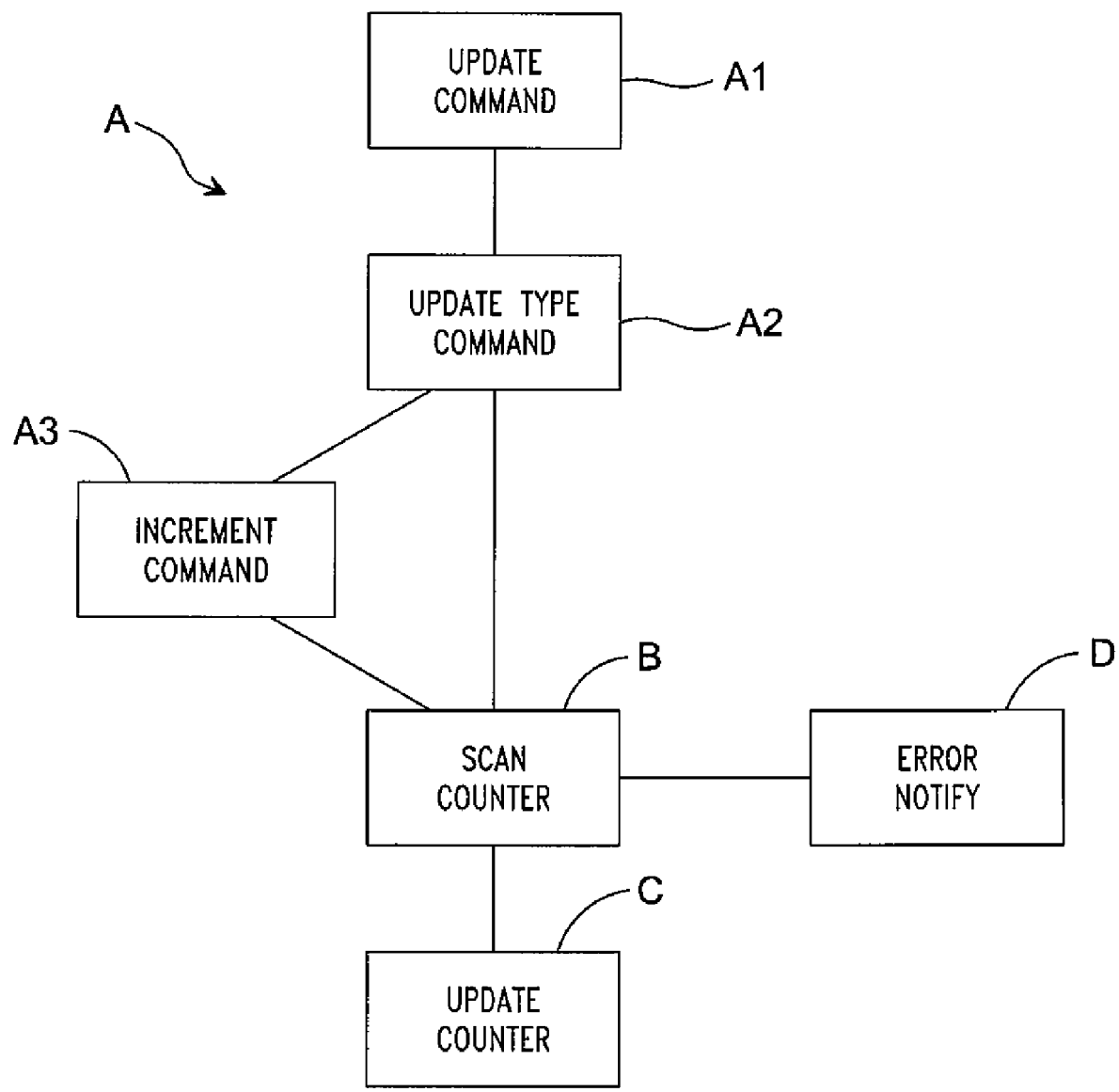
FIG. 6 shows a diagram of the updating method of the counter of the memory device of FIG. 1.

The method for updating the counter is described in the diagram of FIG. 6.

In the phase A the user sends a command D_BUS to update the counter (subphase A1) and a command D_Type to specify the type of updating (subphase A2), that is if it is a monotonic sequential or non-sequential updating. If it is non-sequential updating, a command Incr (subphase A3) will be sent to specify the amount of the increase.

In the phase B the scanning of the sector 11 is done by means of the reading circuitry 3 and it is determined if the updating is allowable or not. The scanning can be made from the least significant bit to the most significant bit or from the most significant bit to the least significant bit.

If the updating is allowable, the counter is increased through the writing circuitry 2 in the phase C.

If the updating is not allowable, there is an error and the user is notified in the phase D.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A non-volatile memory device, comprising:
   a matrix of non-volatile memory cells;
   writing circuitry;
   reading circuitry for said memory cells of the matrix;
   a sector of non-volatile memory cells implementing a counter; and logic means for:
      scanning the memory cells of said sector using said reading circuitry;
      determining whether a first memory cell of said sector stores a first logic value; and
      if the first memory cell stores the first logic value, updating said sector by commanding the writing circuitry to write the first logic value in a second memory cell that is scanned subsequently to the first memory cell.

2. A device according to claim 1, wherein it comprises an interface suitable for interpreting external commands and translating them into binary code to send to said logic means.

3. A device according to claim 1, wherein the first logic value is a zero.

4. A device according to claim 1, wherein the second memory cell is immediately adjacent to the first memory cell.

5. A device according to claim 1, wherein the second memory cell is not immediately adjacent to the first memory cell.

6. A device according to claim 1 wherein said sector contains a least significant bit and a most significant bit, said logic means being suitable for implementing a scanning from the most significant bit to the least significant bit using said reading circuitry.

7. A device according to claim 1, wherein said logic means comprise further means suitable for impeding writing of the first logic value in a memory cell which, in the scanning of the memory cells of said sector, precedes the first memory cell if the first memory cell stores the first logic value.

8. A device according to claim 1, wherein said logic means are constituted by a microcontroller.

9. A device according to claim 1, wherein said sector is constituted by a portion of memory cells belonging to said matrix.

10. A counter, comprising:
    a sector of non-volatile memory cells belonging to a non-volatile memory device, said device including a matrix of non-volatile memory cells associated with writing circuitry and reading circuitry for the memory cells; and
    logic means for:
       scanning the memory cells of said sector using said reading circuitry;
       determining whether a first memory cell of said sector stores a first logic value; and
       if the first memory cell stores the first logic value,
       updating said sector by commanding the writing circuitry to write the first logic value in a second memory cell that is scanned subsequently to the first memory cell.

11. A counter according to claim 10, wherein the first logic value is a zero.

12. A counter according to claim 10, wherein the second memory cell is immediately adjacent to the first memory cell.

13. A counter according to claim 10, wherein the second memory cell is not immediately adjacent to the first memory cell.

14. A counter according to claim 10 wherein said sector contains a least significant bit and a most significant bit, said logic means being suitable for implementing a scanning from the most significant bit to the least significant bit using said reading circuitry.

15. A counter according to claim 10, wherein said logic means comprise further means suitable for impeding writing of the first logic value in a memory cell which, in the scanning of the memory cells of said sector, precedes the first memory cell if the first memory cell stores the first logic value.

16. A method of updating a counter that includes a sector of non-volatile memory cells and a logic controller, said sector containing a least significant bit and a most significant bit, said method comprising:
    scanning said sector from said most significant bit to the least significant bit until a first logic value contained in one of the memory cells of said sector is reached; and
    writing said first logic value in a cell scanned previously to the memory cell containing the first logic value.

17. A method according to claim 16, wherein said first logic value is a zero.

* * * * *